US007265445B2

(12) United States Patent
Wu et al.

(10) Patent No.: US 7,265,445 B2
(45) Date of Patent: Sep. 4, 2007

(54) INTEGRATED CIRCUIT PACKAGE

(75) Inventors: Dolly Wu, Richardson, TX (US); Charles Parkhurst, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/088,110

(22) Filed: Mar. 23, 2005

(65) Prior Publication Data

US 2006/0214285 A1 Sep. 28, 2006

(51) Int. Cl.
*H01L 23/34* (2006.01)

(52) U.S. Cl. ...................... 257/720; 257/666; 257/673; 257/677; 438/11

(58) Field of Classification Search ........ 257/666–733; 438/11, 123, 772–774
See application file for complete search history.

(56) References Cited

U.S. PATENT DOCUMENTS 4,292,647 A 9/1981 Lee
4,937,435 A 6/1990 Goss et al.
4,953,060 A 8/1990 Lauffer et al.
5,073,817 A 12/1991 Ueda
5,325,265 A 6/1994 Turlik et al.
5,959,356 A * 9/1999 Oh ............................ 257/738
6,025,640 A * 2/2000 Yagi et al. .................. 257/666
6,392,301 B1 * 5/2002 Waizman et al. ........... 257/774
6,731,011 B2 * 5/2004 Verma et al. ............... 257/777
6,762,067 B1 * 7/2004 Quinones et al. ............ 438/11
6,774,466 B1 * 8/2004 Kajiwara et al. ........... 257/673

* cited by examiner

*Primary Examiner*—Andy Huynh
*Assistant Examiner*—Tram Hoang Nguyen
(74) *Attorney, Agent, or Firm*—Dolly Wu; W. James Brady; Frederick J. Telecky, Jr.

(57) ABSTRACT

An IC package includes a package body of non-conductive material. A conductive heat-sink pad includes an interior pad portion located within an interior of the package body. An exterior pad portion is located external to the package body. The exterior pad portion includes at least two pad pieces that are spaced apart to define at least one channel that separates the at least two pad pieces, the at least two pad pieces being electrically connected with each other. The at least two pad pieces may be flush with an underside surface of the package body or one or more of the pad pieces may extend outwardly from the package body.

23 Claims, 4 Drawing Sheets

52 50 1 2 3 4 5 6 7 8 56 58 60 62 64 66 68 54

INTEGRATED CIRCUIT PACKAGE

BACKGROUND

Integrated circuits (ICs) such as amplifiers or voltage regulators generate heat as they operate. Excessive heat over an extended period of time can cause damage to an IC. Accordingly, IC packages are typically manufactured to include a structure for dissipating the heat generated by the IC. These components could include, for example, a conductive pad heat sink that has a large surface area. The case of a conductive pad, the conductive pad may be made of metal, such that it is thermally conductive. The IC package may be manufactured such that the conductive pad is in physical contact with the IC on the interior of the IC package, and heat generated from the IC is transferred to the conductive pad. Part of the conductive pad may be located external to the IC package, thus allowing heat to be transferred exterior of the IC package. The conductive pad may also provide a stable ground connection to the IC from a printed circuit board (PCB) on which the IC package is mounted by connecting with one or more layers of the PCB.

FIG. 1 illustrates a prior art example of an IC 10 manufactured within an IC package 12. In the example of FIG. 1, the IC 10 includes an operational amplifier (op amp) circuit 14. The IC 10 has eight terminals. Terminals 1 and 5 of the IC 10, each labeled "NC," are not internally connected. Terminal 2 of the IC 10, labeled "IN−," is a non-inverting input to the op amp circuit 14. Terminal 3 of the IC 10, labeled "IN+," is an inverting input to the op amp circuit 14. Terminal 4 of the IC 10, labeled "$V_s$+," is a negative terminal of the supply voltage to the op amp circuit 14. Terminal 8 of the IC 10, labeled "EN," is an enable input to the op amp circuit 14. Terminal 7 of the IC 10, labeled "$V_s$−," is a positive terminal of the supply voltage to the op amp circuit 14. Terminal 6 of the IC 10, labeled "OUT," is the output terminal of the op amp circuit 14.

As described above, the IC 10 may generate heat as it operates in conjunction with circuitry to which the IC 10 may be connected on an associated PCB. To alleviate excessive heat, the IC package 12 may be manufactured with a conductive pad 16 in contact with and beneath the circuit die 14. The conductive pad 16 may be formed from a type of metal, alloy, or other electrically and thermally conductive material, such that heat generated by the IC 10 may be conducted and transferred through the conductive material to a portion of the conductive pad 16 that is exposed at the underside of the IC package 12. In addition, the exposed conductive pad 16 at the underside of the IC package 12 may be connected to the PCB on which the IC package 12 is mounted, such as by soldering. The connection may further help dissipate heat generated by the IC 10, as well as provide a stable electrical ground connection to the PCB for the IC 10.

A connection may be made between two terminals of an IC. In the example of an opamp circuit, it would be common to feedback connect output terminal 6 of FIG. 1 of the circuit 14 to one of the inputs of the op amp circuit 14, such as terminal 2. Thus, the output terminal OUT of the IC 10 may often be electrically connected to the inverting input terminal IN− of the IC 10.

SUMMARY

The present invention relates generally to an integrated circuit (IC) package.

One aspect of the present invention provides an IC package that includes a package body of non-conductive material. A conductive heat-sink pad includes an interior pad portion located within an interior of the package body. An exterior pad portion is located external to the package body. The exterior pad portion includes at least two pad pieces that are spaced apart to define at least one channel that separates the at least two pad pieces, the at least two pad pieces being electrically connected with each other. The at least two pad pieces may be flush with an underside surface of the package body or one or more of the pad pieces may extend outwardly from the package body.

The channel can be utilized to provide a path between two or more pins of the IC package. Accordingly, pins of the IC package can be connected by an electrically conductive element (e.g., corresponding to a feedback path of an amplifier) extending along the path. As an alternative, the channel can provide a path that extends through the IC package, such as may be used to connect circuit components separate from the IC package.

DETAILED DESCRIPTION

The present invention relates to integrated circuit (IC) packages, and more specifically to heat dissipation in an IC package. A conductive heat-sink pad, as viewed from the underside of an IC package, can be separated into two or more conductive pad pieces that are exposed externally at the underside of the package. The pad pieces are spaced apart to define a non-conductive path. Accordingly, a conductive trace disposed on a printed circuit board (PCB) on which the IC package is mounted can be follow the non-conductive path beneath the IC package, thus allowing the shortest connection path for feedback systems and also conserving usable area (i.e., real estate) on the PCB. The feedback path would also more readily be in thermal equilibrium with the IC die. An interior portion of the conductive pad may include a number of layers deposited upon one another. One or more internal layers of the interior pad portion may include apertures to form a mesh-like structure to help distribute mechanical stress that is often associated with manufacturing the packaged ICs.

The demand for smaller circuit packages is constantly increasing, and thus it is desirable to manufacture PCBs to accommodate more circuit components on a smaller area. However, the area on a PCB occupied by an IC package with a conductive heat sink pad can usually be used for no other purpose. This becomes a design constraint for PCB that conflicts with the money and space saving goals of making the PCB very high density, few layers as possible, or having other circuitry and signal routing on the other side of the PCB. This design constraint is further exacerbated by the common need to provide feedback connections for ICs such as amplifier circuits, thus occupying an even greater area on a PCB. Since PCB's are typically multi-layers, it may be possible to route the feedback on another layer instead of the top layer which comes into direct physical contact with or is even soldered to the heat sink of the IC package. However, this often necessitates increasing the number of PCB layers, which increases cost) or it prevents the most optimal PCB design for heat dissipation purposes. Also, the feedback path is less likely to be in thermal equilibrium with the IC.

Another possible solution for routing a feedback connection for an IC could include routing an electrical trace for the feedback connection around an IC package on the surface of a PCB. However, this solution results in the usage of additional usable area on the PCB which competes with a typical goal to reduce the PCB size or increase the component density on the PCB. Also, routing the trace around the IC package results in a longer trace which is typically undesirable for optimal electrical performance.

Figure 1:
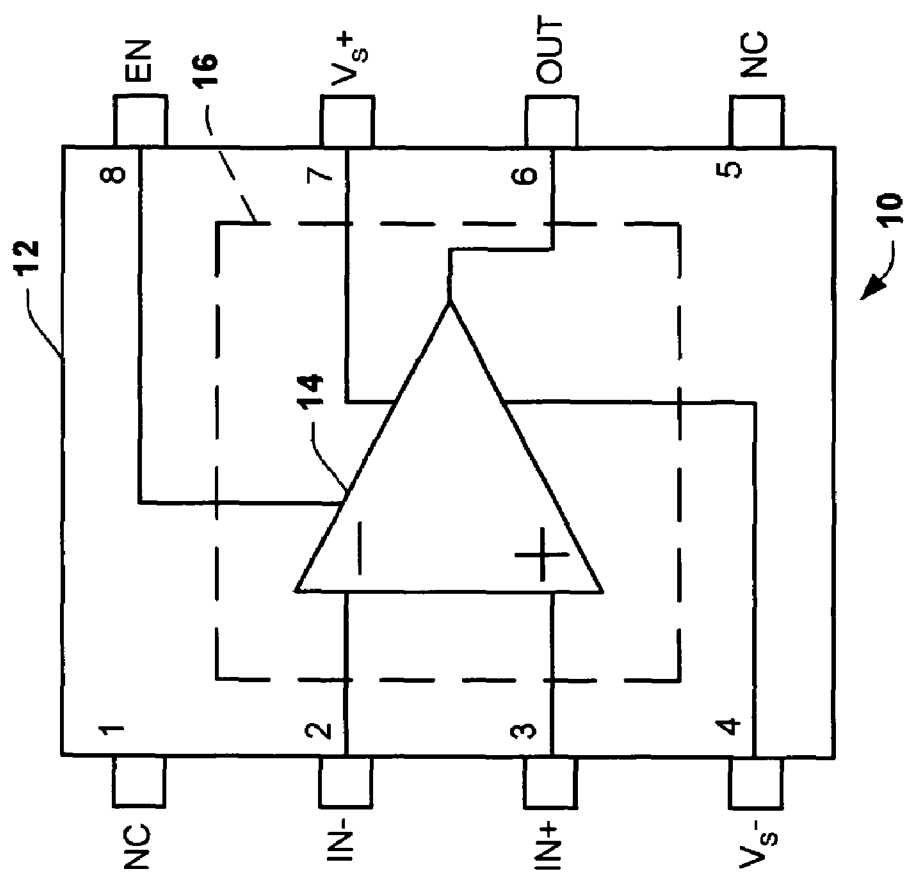
FIG. 1 illustrates an example of a prior art circuit enclosed within an integrated circuit (IC) package.
Figure 2:
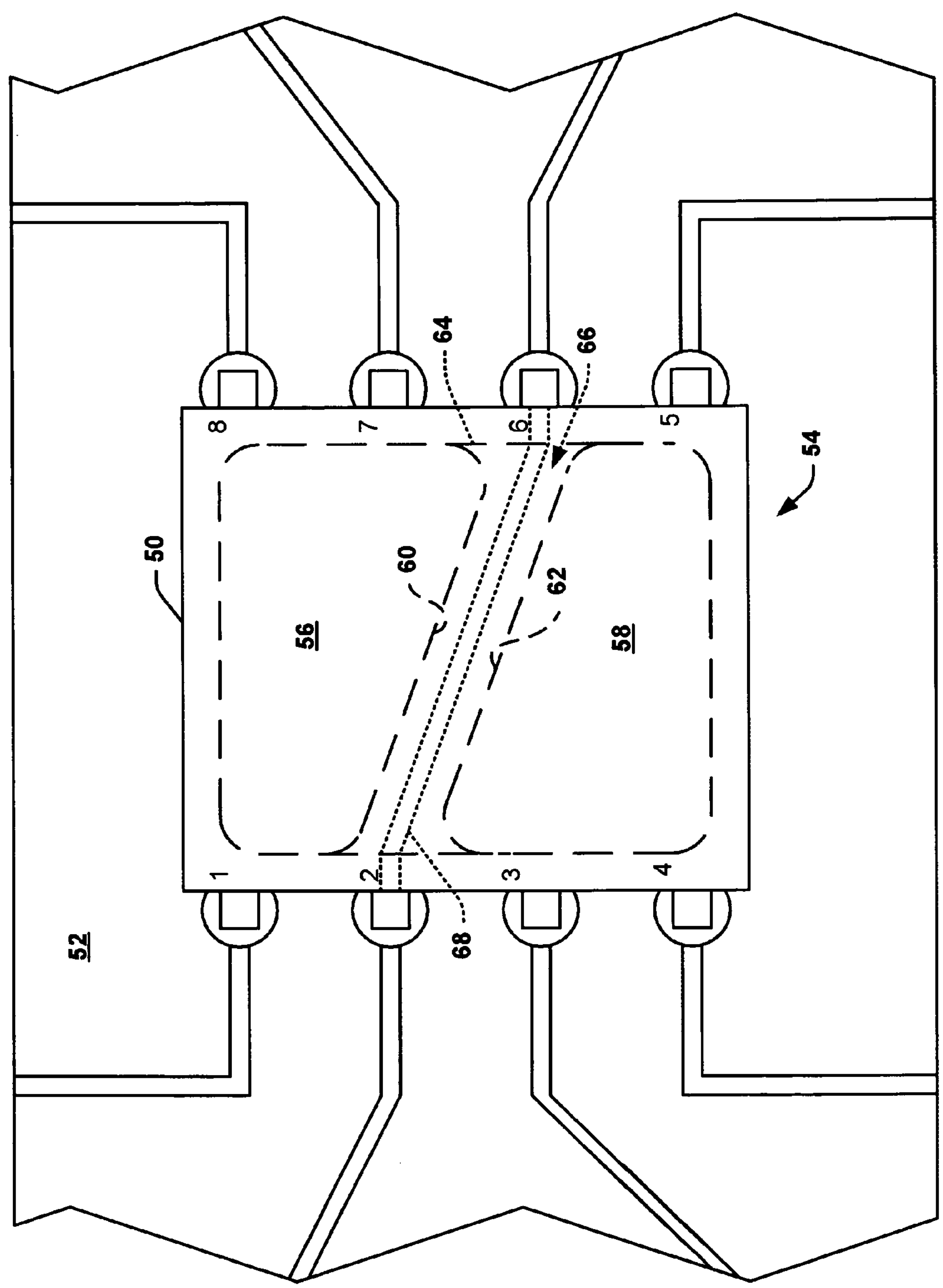
FIG. 2 illustrates an IC package on a printed circuit board (PCB) in accordance with an aspect of the invention.

FIG. 2 illustrates an IC package 50 mounted on a PCB 52 in accordance with an aspect of the invention. The IC package 50 includes a conductive heat-sink pad 54, which may include one or more stacked layers of electrically conductive material (e.g., copper or aluminum). The IC package 50 is formed a non-conductive or insulating material that encapsulates the IC (or die) and a substantial portion of the conductive pad 54. Common package materials include ceramic and plastic materials, although the present invention is not to be limited to any type of package material. Examples of some types of IC packages that can be implemented according to an aspect of the present invention include Thin Small Outline Package (TSOP), Small Outline Integrated Circuit (SOIC), Micro-Lead Frame (MLF), Small Outline Transistor (SOT), Quad Flat No Lead (QFN), and Ball Grid Array (BGA), although the present invention is applicable to other types of packages.

The bottom layer (i.e., the layer furthest away from the IC) of the conductive pad 54 includes two or more substantially conductive pad pieces 56 and 58. The pad pieces 56 and 58 are electrically connected to each other and to the associated IC through one or more other layers of the conductive pad 54, although the pad portions could be directly connected with the IC. At least a portion of each of the pad pieces 56 and 58 are externally exposed relative to the IC package 50. The exposed conductive pad pieces 56 and 58 may be electrically and physically connected (e.g., via solder) to one or more corresponding electrical contacts on the surface of the PCB 52, such as to provide a stable ground connection from the IC within the IC package 50 to the PCB 52. The pad pieces 56 and 58 can also dissipate heat generated from an IC (not shown) within the IC package 50. The aggregate perimeter of the exposed pad pieces 56 and 58 defines a surface area that is greater than about one-half the lower surface area of the IC package to facilitate heat dissipation.

The conductive pad pieces 56 and 58 include respective facing side edge 60 and 62. The facing side edges 60 and 62 are spaced laterally apart from each other to define a non-conductive channel 64 that extends to provide a non-conductive path between the pad pieces 56 and 58. As used herein, the term "channel" is used to describe an area or volume of non-conductive material, which can include non-conductive packaging material, air or a combination of packaging material and air, located between two or more conductive pad portions. Moreover, the term "channel" does not imply any particular depth dimension along the respective side edges 60 and 62 of the pad pieces 56 and 58, as the pad portions may be substantially flush with the package material at lower surface of the IC package 50 or may extend outwardly beyond the package material at the lower surface. The channel 66 can be of sufficient width to allow one or more electrical traces 66 formed on the surface of the PCB 52 to traverse the channel. The channel 66 is also of sufficient width such that neither of the conductive pad pieces 56 and 58 are electrically connected to the electrical trace 68. The channel 66 can be linear or curved, for example The term "channel" further is not intended to imply that any particular type of method of fabrication is utilized to form the channel. For example, the channel may be formed by removing (e.g., cutting, sawing, drilling or etching) a portion of the conductive pad from the underside of the IC package 50 to form a desired dimension and configuration of channel. When the channel is formed by removing metal material, the metal typically can be prior to applying the non-conductive package material, such that a layer of non-conductive package material can be formed in the channel 66 along the bottom surface IC package. Alternatively, the conductive pad pieces and channel 66 can be formed after the package material has been applied, in which case the surface of channel can be formed of the same material as the conductive pad pieces 56 and 58 (e.g., a continuous metal material along the sidewalls and bottom surface of the channel). As another alternative, the channel 66 may be formed concurrently with the conductive pad pieces 56 and 58 by depositing the conductive material (e.g., metal) to form the pad portions through an appropriately configured mask or deposition followed by a cutting or other process for removing a portion of the exposed conductive pad to provide a channel having a desired depth and contour. Those skilled in the art may appreciate various other approaches that can be employed to form the channel 66, all of which are contemplated as falling within the scope of the appended claims.

In the example of FIG. 2, the channel 66 between the conductive pad pieces 56 and 58 provides a non-conductive path between the terminals 2 and 6 of the IC package 50. The electrical trace 68 thus can follow (e.g., an intermediate part of the trace extends co-extensively along) the channel 66. The trace 68 thus provides an electrical connection (e.g., feedback) underneath the IC package 50 to electrically connect terminals 2 and 6. The channel thus electrically isolates the electrical trace 68 from the pad pieces 56 and 58 in a manner that can help optimize usable area on the PCB 52. Also, because the channel 64 and electrical trace 68 are substantially linear (e.g., the shortest distance between the terminals 2 and 6), inductance and parasitic capacitance can be mitigated, thus enabling improved performance of the IC within the IC package 50.

Additionally, by routing the electrical trace 68 for the feedback connection underneath the IC package 50 on the surface of the PCB 52, the IC within the IC package 50 and the feedback loop may operate at a temperature more uniform with the IC. Operating at a uniform temperature can reduce signal distortion as well as increase power supply rejection ratio (PSRR), resulting in a more enhanced performance of the IC within the IC package 50. By implementing an IC package according to the example of FIG. 2, the electrical trace 68 can be disposed on the top layer of the PCB 52 to enable improved heat dissipation. This can mitigate the occurrence of a short circuit or other detrimental circumstances that might occur when signal trace is disposed underneath a solid, one-piece type of heat sink.

The conductive pad pieces 56 and 58 are depicted in the example of FIG. 2 as having rounded or curved corners. Since electromagnetic interference (EMI) tends to be greater at 90° planar intersections of a conductive material, normally-planar intersections and corners of the conductive pad 54, as well as the conductive pad pieces 56 and 58, may be rounded or curved to reduce EMI emissions. By employing rounded or curved corners and non-orthogonal planar intersections, reduced levels of EMI could help improve the performance of the IC implemented within the IC package 50. It is to be understood that, although the example of FIG. 2 depicts that the corners of the pad pieces 56 and 58 as being rounded or curved, such corners could also be beveled or chamfered non-orthogonal to achieve similar results.

Figure 3:
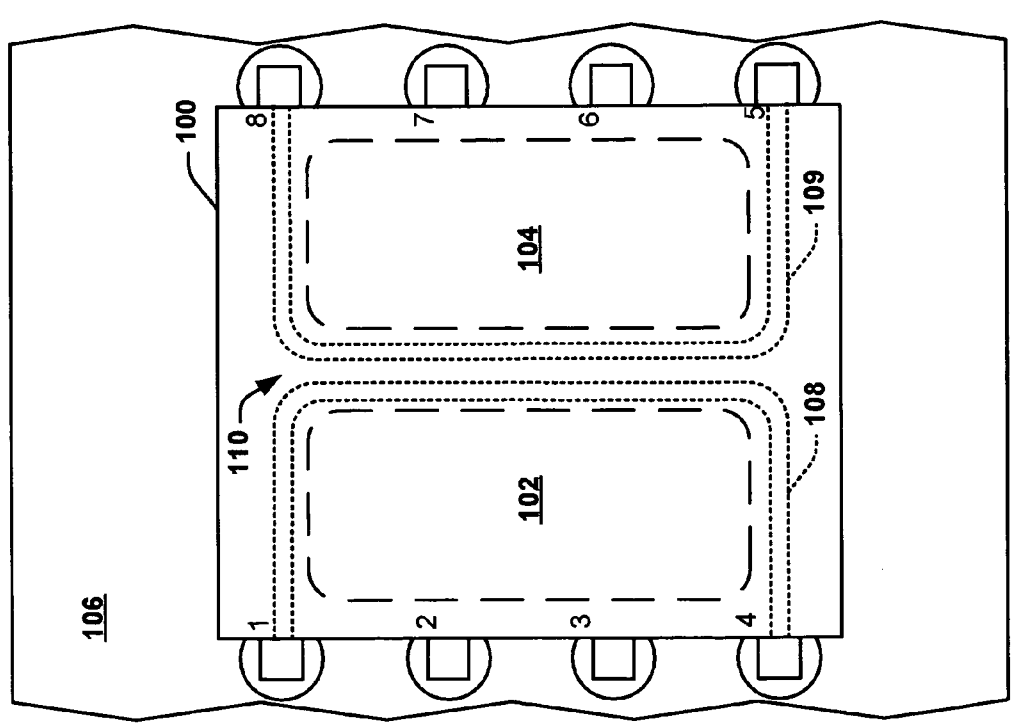
FIG. 3 illustrates an IC package in accordance with an aspect of the invention.

It is to be understood that the conductive pad pieces 56 and 58 may be arranged in any shape or configuration upon manufacture to facilitate an electrical trace interconnection on the surface of the PCB 52 between any of the terminals of the IC package 50. As another example, FIG. 3 depicts an IC package 100 that includes two conductive pad pieces 102 and 104, mounted on a PCB 106. In the example of FIG. 3, the conductive pad pieces 102 and 104 are generally rectangular in shape. The conductive pad pieces 102 and 104 are spaced apart along opposing sided edges to provide a non-conductive channel 110 that extends longitudinally between the two conductive pad pieces. An IC (not shown) within the IC package 100 includes eight terminals. In the example of FIG. 3, terminals 1 and 4 of the IC package are connected by an electrical trace 108 that extends through the channel 110. Additionally, terminals 5 and 8 are electrically connected by another electrical trace 109 that extends through the channel 110. As a result, more than one electrical trace, 108 and 109, as depicted in FIG. 3, are able to run underneath the IC package 100. This arrangement of conductive pad pieces 102 and 104 of FIG. 3 could also allow an electrical trace running through the channel 110 between other terminals of the IC package 100.

Figure 4:
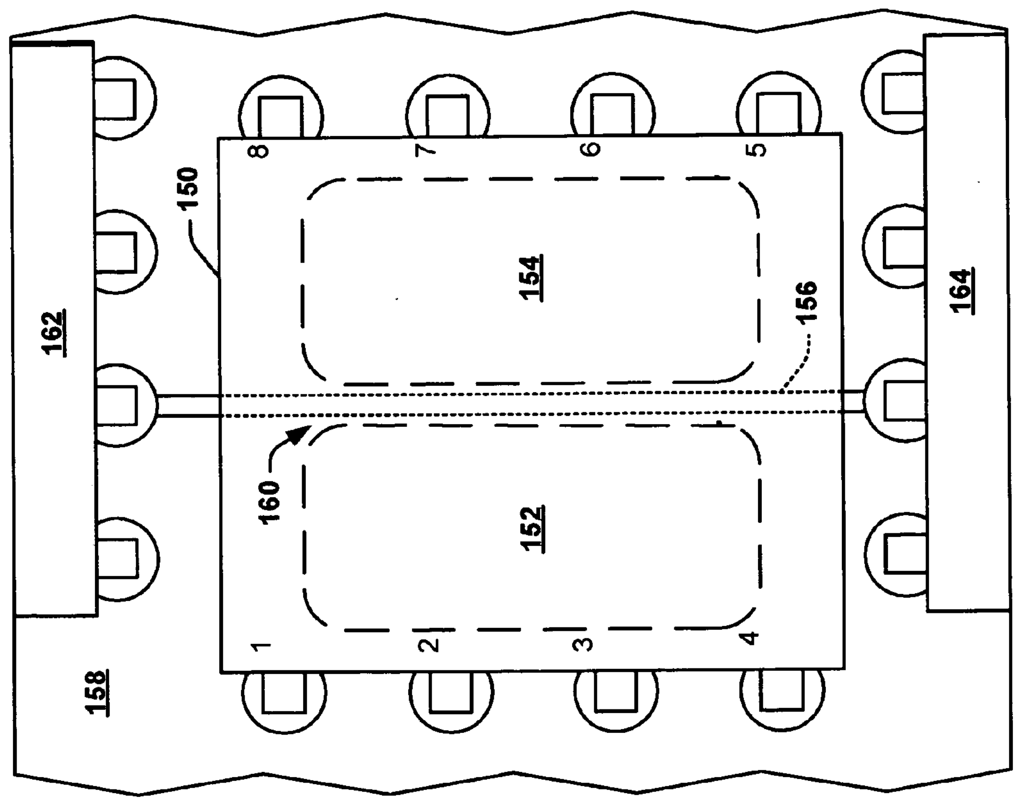
FIG. 4 illustrates an IC package in accordance with an aspect of the invention.

FIG. 4 illustrates an example of another IC package 150 that includes two rectangular conductive pad pieces 152 and 154. The pad pieces 152 and 154 are arranged in a similar manner as the conductive pad pieces 102 and 104 in FIG. 3. The arrangement of conductive pad pieces 152 and 154 allows for one or more electrical traces 156 disposed on the surface of a PCB 158 to extend through a corresponding non-conductive channel 160 defined by a space between pad pieces 152 and 154. However, in contrast to the example of FIG. 3, the electrical trace 156 does not connect to any terminals of an IC within the IC package 150. Instead, in the example of FIG. 4, the conductive trace 156 extends along the surface of the PCB 158 along the channel 160 between the conductive pad pieces 152 and 154 to connect two or more other circuit devices or components on the PCB 158, such as circuit devices 162 and 164. The arrangement of FIG. 4 thus could allow for a shorter electrical trace between two or more other components on a PCB and an overall savings of usable area of the PCB.

Figure 5:
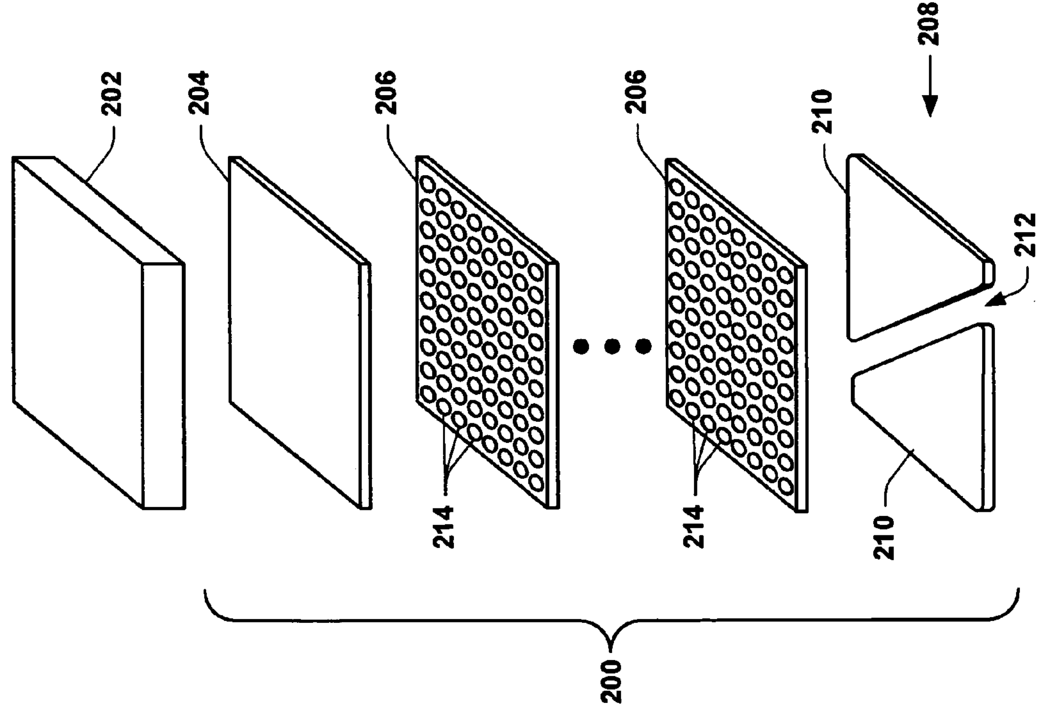
FIG. 5 illustrates an exploded view of an IC and layers of a conductive pad in accordance with an aspect of the invention.

FIG. 5 illustrates an assembly view of a conductive heat-sink pad assembly 200 that may include more than one layer in accordance with an aspect of the invention. The pad assembly 200 can be situated beneath and in contact with an IC, schematically shown at 202. Both the conductive pad assembly 200 and the IC 202 typically are included within an IC package (not shown). A top layer 204 of the conductive pad assembly 200 may be a solid layer as depicted in FIG. 5, such that the top layer 204 contacts the IC 202 with a substantial portion of its surface area for the purpose of conducting heat from the IC 202 and providing an electrical ground connection to a PCB (not shown). However, beneath the top layer 204, the conductive pad assembly 200 may include a number N of intermediate electrically and thermally conductive layers 206, where N is an integer ($N \geqq 0$), interposed between the top layer 204 and a bottom layer 208 of the conductive pad assembly 200. The intermediate layers 206 usually are entirely encapsulated within an interior of the IC package body along with the IC 202 and top layer 204.

The bottom layer 208 of the conductive pad assembly 200 is electrically connected with the IC 202 through the intermediate layers 206 and the top (or interface) layer 204 that is connected directly with the IC. The IC 202 can be substantially superposed relative to the conductive pad assembly 200, such that corresponding side edges of the IC are generally aligned with corresponding outer side edges of the conductive pad. The bottom layer 208 includes two or more separate conductive pad pieces 210, at least a portion of which will be externally exposed relative to the IC package. The exposed pad pieces 210 may be soldered to the PCB. The exposed pad pieces 210 further facilitate heat dissipation, such as heat generated from the IC 202. The exposed surface area of the pad pieces 210 can dimensioned and configured to be greater than about one-half the lower surface area of the IC package to facilitate heat dissipation further. The pad pieces 210 also can be employed provide a stable electrical ground connection from the IC 202 to the PCB. The conductive pad pieces 210 may be sufficiently separated from each other such that a channel 212 is provided between the two conductive pad pieces 210. The channel 212 can be of sufficient width to allow an electrical trace on the surface of the PCB to traverse the channel, in accordance with an aspect of the invention.

Each of the intermediate layers 206 of the conductive pad assembly 200 may include a number of apertures 214 extending through each of the respective intermediate layers 206 to form a mesh-like structure. The mesh-like structure is operative to provide a degree of flexibility or non-rigidity that can help distribute mechanical stress within the package so as to reduce the possibility of damage that may occur to the IC 202, such as during the IC package manufacturing process. The apertures 214 are depicted in FIG. 5 as being in a uniformly distributed rectangular pattern on each of the intermediate layers. However, it is to be understood that the apertures 214 need not be uniformly distributed and need not be the same size or configuration from one to the next of the intermediate layers 206. Each of the apertures 214 may be filled with a flexible non-conductive material, such as a (e.g., the package material or other flexible insulating material) or an inert gas (e.g., air). It is to be understood that the conductive pad assembly 200 may include different combinations of layers and/or configurations, such as, for example, the inclusion of additional solid layers, varying thickness from one layer to the next, or additional intermediate layers of a size substantially equal to each of the conductive pad pieces. Also, in accordance with an aspect of the invention, the inner periphery of the apertures 214 can have a variety of shapes, such as rounded, beveled, or non-orthogonal, so as to reduce EMI.

Figure 6:
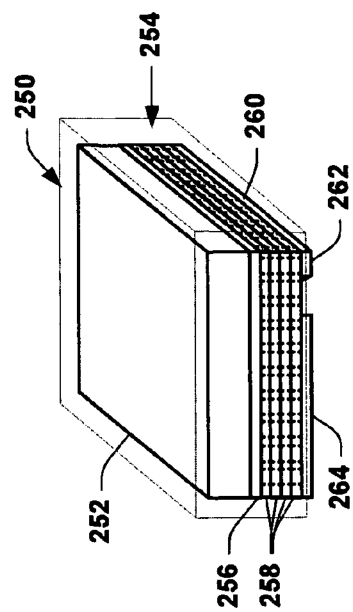
FIG. 6 illustrates an IC and layers of a conductive pad in accordance with an aspect of the invention.

FIG. 6 illustrates an IC assembly 250, such as could be included within an IC package body (shown as dotted lines). The IC assembly includes an IC 252 and a conductive pad 254. The conductive pad 254 includes a plurality of layers, similar to those depicted in FIG. 5. In the example of FIG. 6, the conductive pad 254 includes a top (or interface) pad layer 256 electrically and thermally connected with the IC 252. A plurality (e.g., four) intermediate layers 258 are electrically coupled and interposed between the top pad layer 256 and a bottom pad layer 260. The intermediate layers 258 can each include a plurality of apertures (each layer defining a mesh-like sheet) to augment structural integrity and distribute mechanical stress throughout the IC assembly 250. The bottom layer 260 includes two or more pad pieces 262 and 264 that are spaced apart from each other by a non-conductive channel extending between the pad pieces. The pad pieces 262 and 264 are electrically connected to each other and to the IC 252 through one or more of the other layers 256 and 258 of the pad 254.

It is to be understood and appreciated that the conductive pad 254 may have greater or fewer solid layers 256 and intermediate layers 258 than the example shown in FIG. 6. It is to be further understood that the opposing surface areas of the respective layers 256 and 258 of the conductive pad 254 need not occupy the same surface area as the IC 252, but may instead occupy a larger or smaller cross-sectional area than the IC 252. An assembly included within an IC package is not limited to the IC assembly 250 depicted in FIG. 6. The IC assembly 250 could include, for example, a plurality of ICs 252 in contact with one or more conductive pads 254. Additionally, the conductive pad 254 may also include any other configuration to increase surface area contact with the IC 252 for the purpose of more efficient heat dissipation, such as, for example, by contacting the sides of the IC 252 in addition to the bottom of the IC 252.

What have been described above are examples of the present invention. It is, of course, not possible to describe every conceivable combination of components or methodologies for purposes of describing the present invention, but one of ordinary skill in the art will recognize that many further combinations and permutations of the present invention are possible. For example, layers of a conductive pad can be manufactured in varying dimensions dependent upon application requirements. Accordingly, the present invention is intended to embrace all such alterations, modifications, and variations that fall within the spirit and scope of the appended claims.

What is claimed is:

1. An integrated circuit (IC) package comprising:

a package body of a nonconductive material; and a conductive heat-sink pad, located at the underside of the package body, comprising an interior pad portion located within an interior of the package body and an exterior pad portion located external to the package body, the exterior pad portion comprising at least two pad pieces that are spaced apart to define at least one channel that separates the at least two pad pieces, the at least two pad pieces being electrically conducting connected, free of bondwires, with each other within the interior of the package body.

2. The IC package of claim 1, wherein each of the at least two pad pieces includes a side edge that faces the side edge of at least one other of the at least two pad pieces, the facing side edges being spaced laterally apart from each other to define the at least one channel.

3. The IC package of claim 1, wherein the non-conductive material extends along the channel between the at least two pad pieces to provide a non-conductive path between at least two terminals of the IC package.

4. The IC package of claim 1, wherein the at least one channel is dimensioned and configured to provide a path through which an electrically conductive element can traverse.

5. The IC package of claim 1, wherein the at least one channel provides a path between at least two pins of the IC package for providing an electrical connection between the at least two pins.

6. The IC package of claim 1, further comprising: at least one IC located within the package material substantially superposed relative to the interior pad portion of the conductive heat-sink pad; and wherein the interior pad portion of the conductive heat-sink pad further comprises a conductive interface layer between the at least one IC and the at least two pad pieces, the conductive interface layer superposed over the at least two pad pieces, together.

7. The IC package of claim 6, wherein the conductive heat-sink pad further comprises at least one conductive layer; the conductive interface layer couples to the IC, and the at least one conductive layer is interposed between the conductive interface layer and the at least two pad pieces.

8. The IC package of claim 7, wherein the conductive interface layer comprises a substantially solid layer; and the at least one conductive layer further comprising a plurality of apertures extending transversely therethrough.

9. The IC package of claim 8, wherein each of the plurality of apertures comprises an inner periphery that is one of curved, beveled, or non-orthogonal.

10. The IC package of claim 1, wherein each of the at least two pad pieces comprises side edges interconnecting first and second side surfaces thereof, the intersection between the side edges and the first and second surfaces of each of the respective plurality of conductive pad portions being one of curved beveled, or non-orthogonal.

11. An integrated circuit (IC) package comprising:

an IC located within an interior of the IC package;

a heat-sink pad assembly comprising an first interior pad portion coupled to and substantially superposed relative to the IC, the pad assembly further comprising an exterior pad portion with at least two external pad pieces that are exposed externally relative to an underside non-conductive surface of the IC package, the externally exposed pad pieces being spatially arranged to define at least one substantially non-conductive channel that separates the exposed pad pieces;

the heat-sink pad assembly further comprising a second interior pad portion, situated between the first interior pad portion and the exterior pad portion; and the first and second interior pad portions and the exterior pad portion are conductive.

12. The IC package of claim 11, wherein the at least one channel provides a path between at least two pins of the IC package for providing an external electrical connection between the at least two pins, whereby the connection can be routed underneath the package using a short board trace with no vias instead of routing around the entire package or via-ing to another PCB board layer.

13. The IC package of claim 11, wherein the externally exposed pad pieces extend outwardly from the underside non-conductive surface of the IC package, each of the externally exposed pad pieces having a side edge that faces an adjacent side edge of at least one other of the at least two pad pieces, the facing side edges being spaced laterally apart from each other to define the at least one channel.

14. The IC package of claim 12, wherein the interior pad portion of the pad assembly further comprises a plurality of electrically conductive layers, the plurality of layers comprising an conductive interface layer coupled to the IC, the externally exposed pad pieces being electrically and thermally connected with the conductive interface layer.

15. The IC package of claim 14, wherein the interior pad portion of the pad assembly further comprises at least one intermediate layer between the conductive interface layer and the externally exposed pad pieces, the at least one intermediate layer having a plurality of apertures extending therethrough, each of the plurality of apertures comprising an inner periphery that is one of curved, beveled, or non-orthogonal.

16. An integrated circuit (IC) package comprising:

at least one IC located within a substantially non-conductive material that forms a body of the IC package;

means for electrically connecting the IC to an externally exposed portion thereof located adjacent a distal surface of the IC package;

means for dissipating heat from the underside of the IC via the means for electrically connecting;

means for providing a substantially non-conductive path along the exterior of the body of the IC package, the non-conductive path extending between and separating at least two pieces of the externally exposed portion of the means for electrically conductive connecting; and means for reducing a stress on the IC by providing at least one conductive interface layer coupled to the IC and between the IC and the at least two pieces, the at least one conductive interface layer superposed over the at least two pad pieces together.

17. An integrated circuit (IC) package comprising:

at least one IC located within a substantially non-conductive material that forms a body of the IC package;

means for electrically connecting the IC to an externally exposed portion thereof located adjacent a distal surface of the IC package;

means for dissipating heat from the IC via the means for electrically connecting, means for providing a substantially non-conductive path along the exterior of the body of the IC package, the non-conductive path extending between and separating at least two pieces of the externally exposed portion of the means for electrically connecting;

means for reducing a stress on the IC by providing at least one conductive interface layer coupled to the IC and between the IC and the at least two pieces, the at least one conductive interface layer superposed over the at least two pad pieces together; and wherein the means for providing a substantially non-conductive path provides the path between at least two pins of the IC package for providing an electrical connection between the at least two pins, whereby the electrical connection can be routed underneath the package using a short trace with no vias instead of routing around the entire package or via-ing to another PCB board layer.

18. The IC package of claim 17, further comprising means for electrically connecting the at least two pins of the IC package; and the means for dissipating heat also providing means for reducing inductance through a large electrical connection area and volume.

19. The IC package of claim 1, wherein the at least two pad pieces have a combined area that is nearly comparable to the area of the interior pad portion.

20. The IC package of claim 11, wherein the first interior pad portion is substantially solid, and the second interior pad portion and the exterior pad portion have different apertures.

21. The IC package of claim 11, wherein the first interior pad portion is substantially solid, and the second interior pad portion and the exterior pad portion have different apertures.

22. An integrated circuit (IC) package for at least one IC, the IC package comprising:

a package body of a non-conductive material;

a conductive heat-sink pad, located at the underside of the package body, comprising an interior pad portion located within an interior of the package body and an exterior pad portion located external to the package body, the exterior pad portion comprising at least two pad pieces that are spaced apart to define at least one channel that separates the at least two pad pieces, the at least two cad pieces being electrically conducting connected with each other within the interior of the package body;

the conductive heat-sink pad further comprises at least one conductive interface layer coupled to the IC, situated between the at least one IC and the at least two pad pieces; and at least one of the at least one conductive interface layers has apertures.

23. The IC package of claim 22, wherein the at least one channel is dimensioned and configured to provide a path through which an electrically conductive element can traverse.

* * * * *